(12) United States Patent
Kim et al.

(10) Patent No.: US 11,614,488 B2
(45) Date of Patent: Mar. 28, 2023

(54) METHOD AND APPARATUS FOR REAL-TIME ESTIMATION OF FULL PARAMETERS OF PERMANENT MAGNET SYNCHRONOUS MOTOR

(71) Applicant: Korea Advanced Institute of Science and Technology, Daejeon (KR)

(72) Inventors: Kyung Soo Kim, Daejeon (KR); Kyung Hwan Choi, Daejeon (KR); Seok Kyoon Kim, Daejeon (KR)

(73) Assignee: Korea Advanced Institute of Science and Technology, Daejeon (KR)

(*) Notice: Subject to any disclaimer, the term of this patent is extended or adjusted under 35 U.S.C. 154(b) by 35 days.

(21) Appl. No.: 17/324,215

(22) Filed: May 19, 2021

(65) Prior Publication Data
US 2021/0364573 A1 Nov. 25, 2021

(30) Foreign Application Priority Data

May 19, 2020 (KR) .......................... 10-2020-0059976

(51) Int. Cl.
| | | |
|---|---|---|
| G01R 31/34 | (2020.01) | |
| G01R 27/14 | (2006.01) | |
| H02P 23/14 | (2006.01) | |
| G01R 27/26 | (2006.01) | |
| H02P 21/14 | (2016.01) | |

(52) U.S. Cl.
CPC .......... *G01R 31/343* (2013.01); *G01R 27/14* (2013.01); *G01R 27/2611* (2013.01); *G01R 31/346* (2013.01); *H02P 21/141* (2013.01); *H02P 23/14* (2013.01)

(58) Field of Classification Search
CPC ..... G01R 31/343; G01R 27/14; H02P 21/141; H02P 23/14; H02P 21/14; H02P 6/007; H02P 2207/05
USPC .............................. 318/400.02, 400.01, 700
See application file for complete search history.

(56) References Cited

U.S. PATENT DOCUMENTS 7,825,620 B2 * 11/2010 Nakatsugawa ......... H02P 21/22
                                                                318/800
10,097,118 B2 * 10/2018 Introwicz ................ H02P 6/186

* cited by examiner

*Primary Examiner* — David Luo
(74) *Attorney, Agent, or Firm* — Lex IP Meister, PLLC

(57) ABSTRACT

Disclosed is a method and apparatus for real-time estimation of full parameters of a permanent magnet synchronous motor. According to this method and apparatus, it is possible to estimate in real time all four parameters of a permanent magnet synchronous motor without additional signal injection. In addition to the state equation, the "stator current ripple model" is additionally used to fundamentally solve the rank deficiency problem in the state equation without injecting additional signals. All four parameters of a permanent magnet synchronous motor can be estimated in real time.

13 Claims, 17 Drawing Sheets

[Fig. 1A]
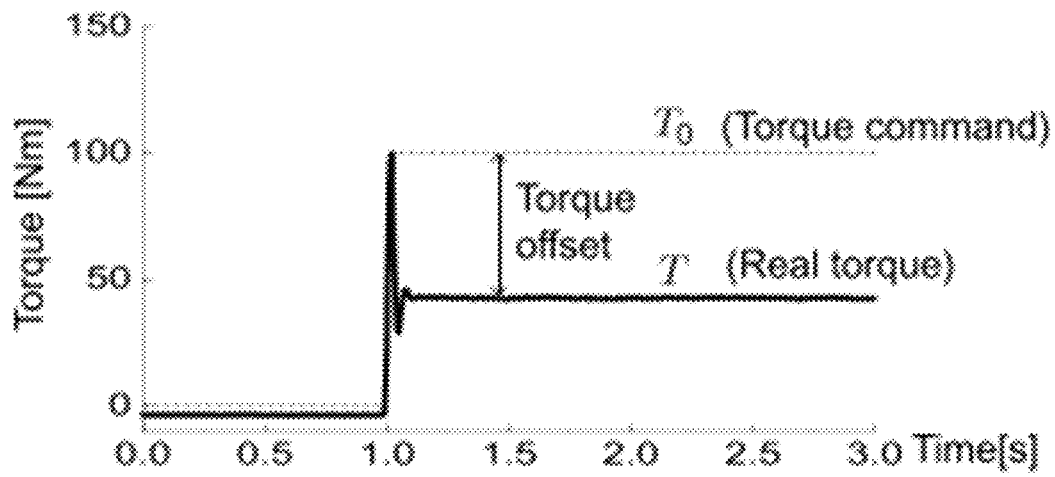
[Fig. 1B]
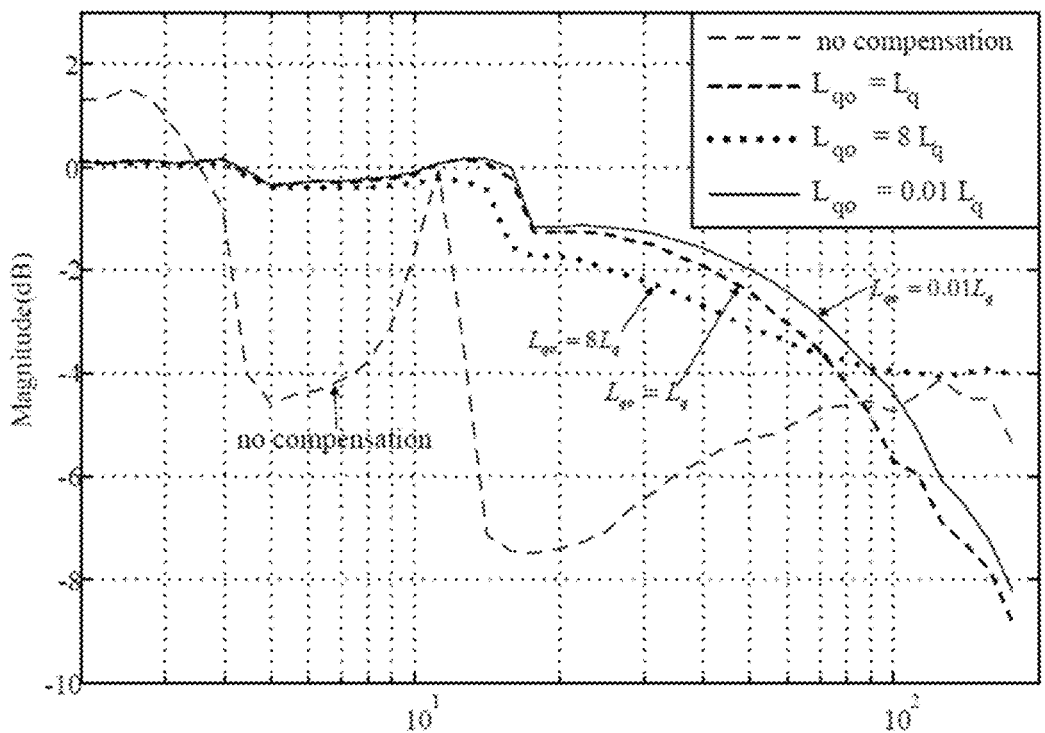

[Fig. 2A]
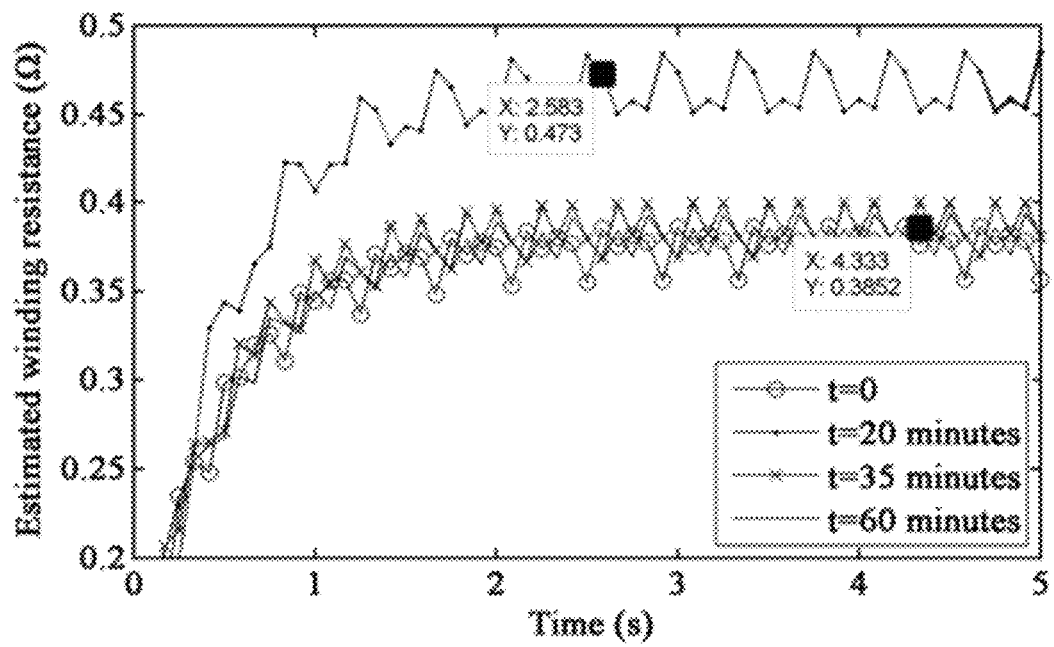
[Fig. 2B]
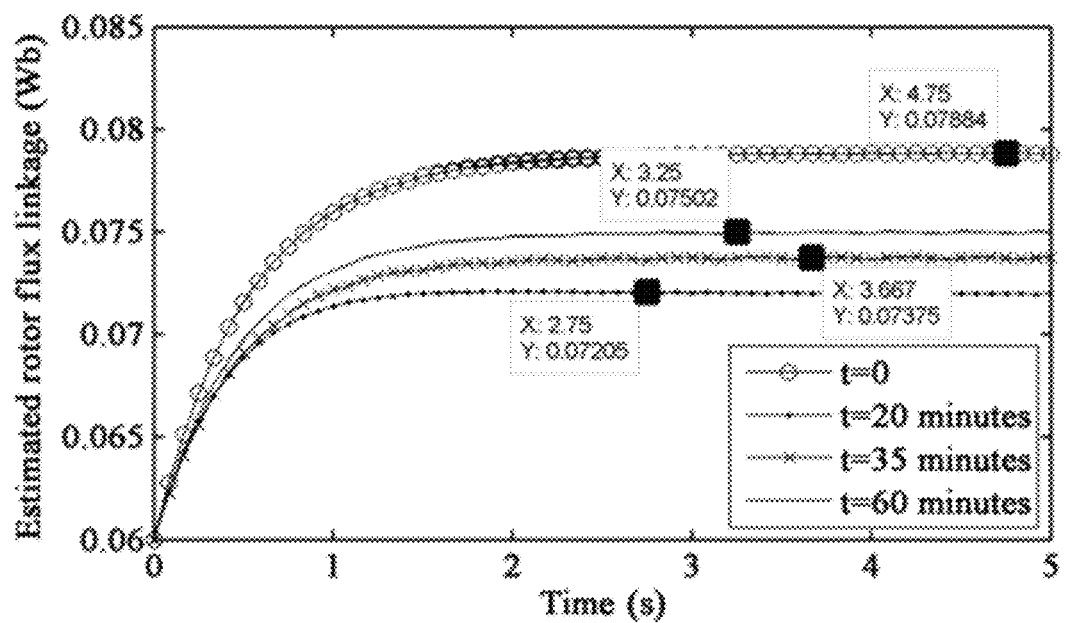

[Fig. 3A]
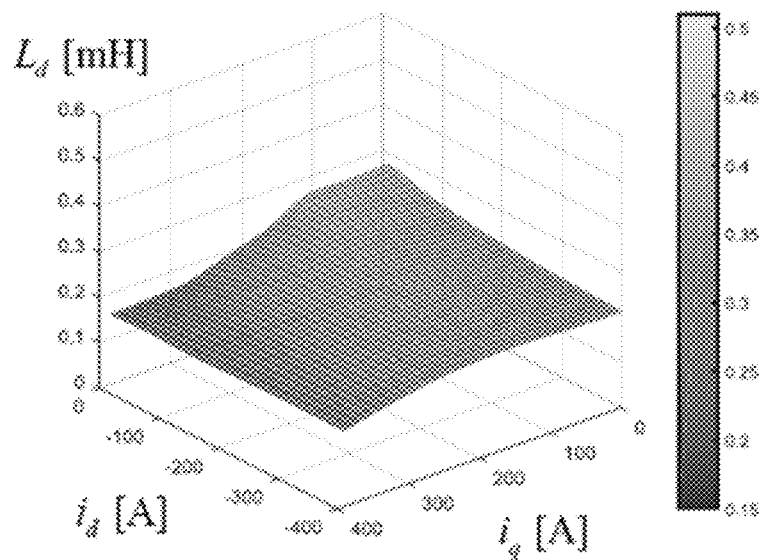
[Fig. 3B]
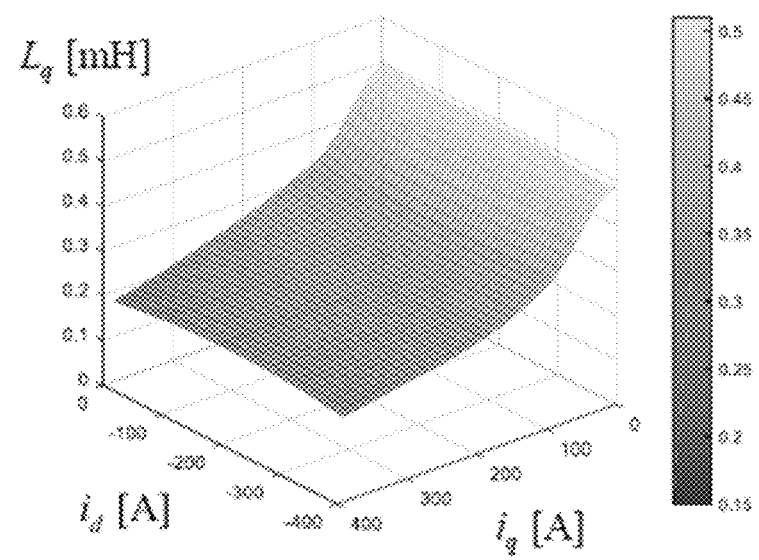

[Fig. 3C]
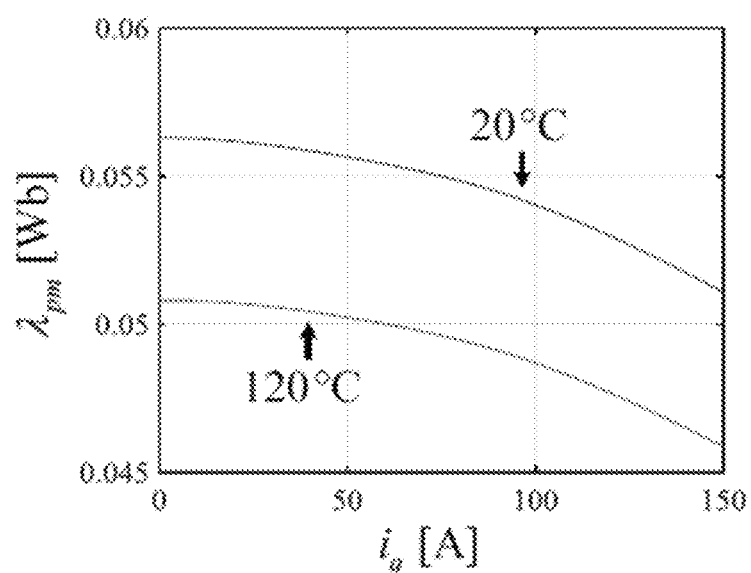

[Fig. 4A]
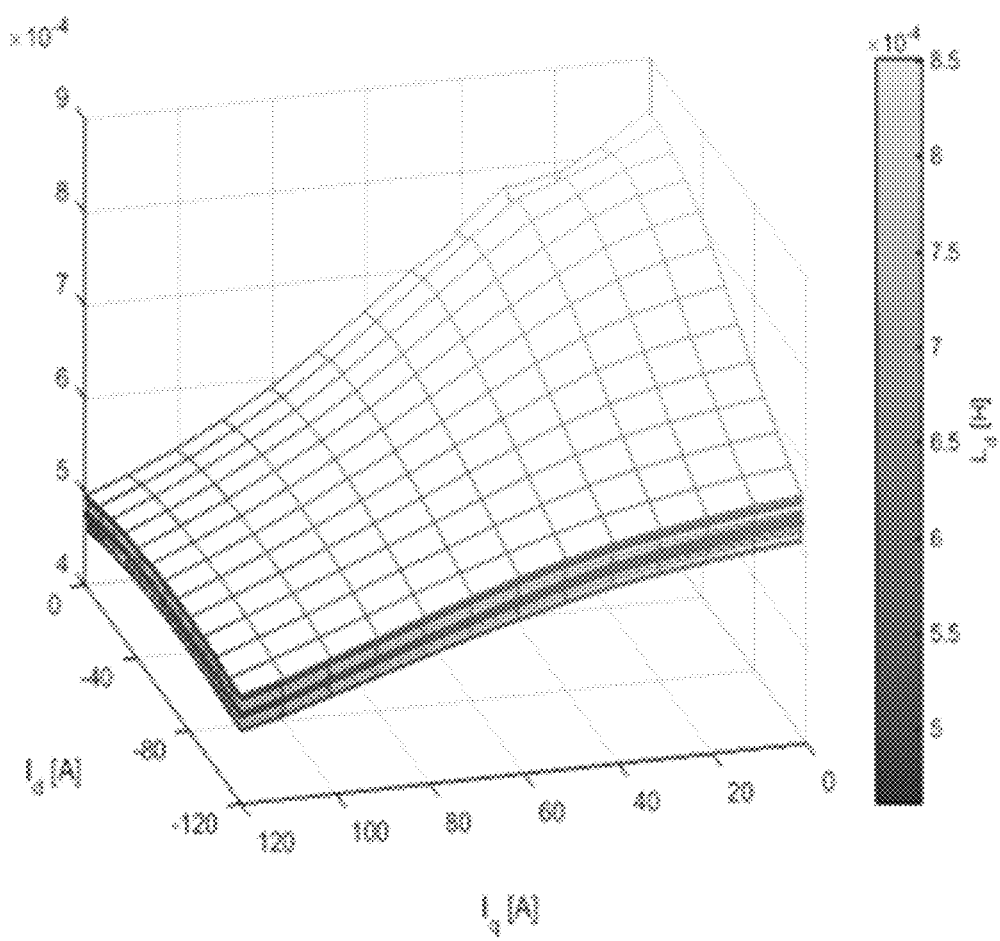

[Fig. 4B]
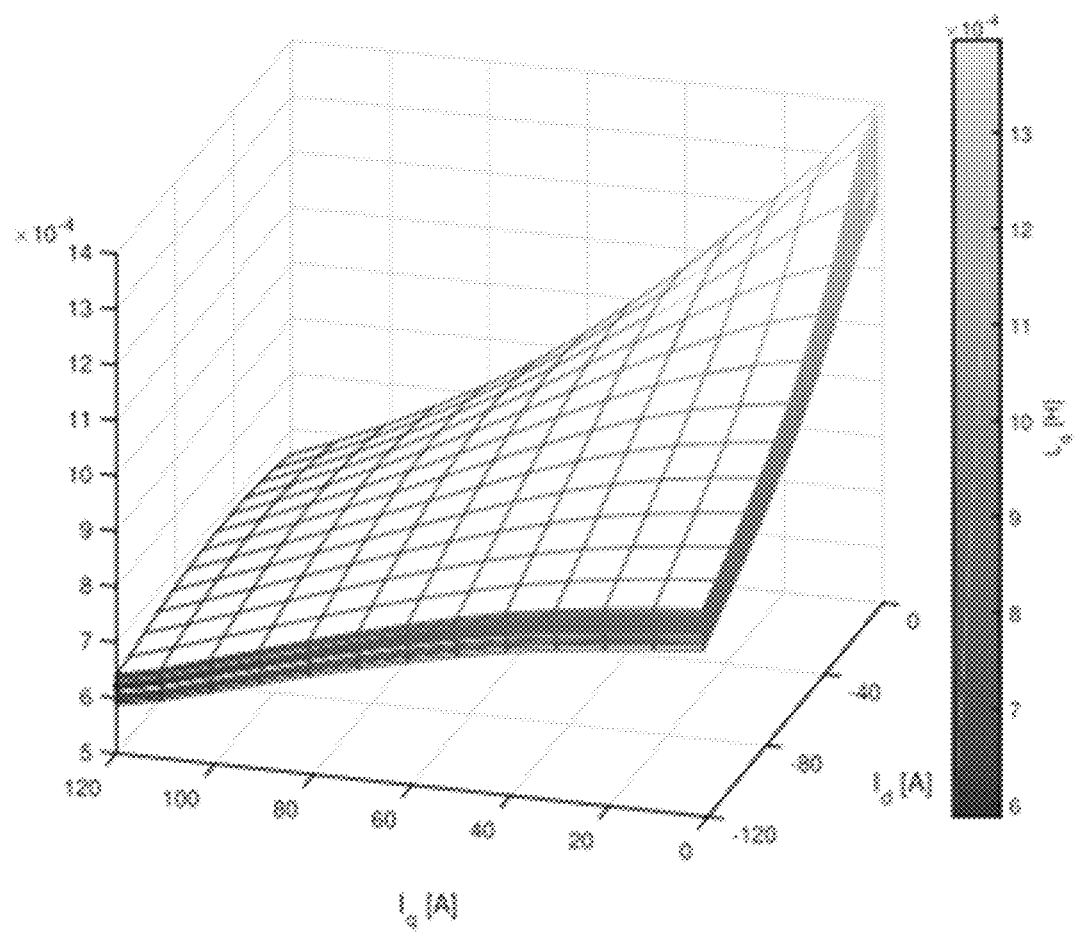

[Fig. 4C]
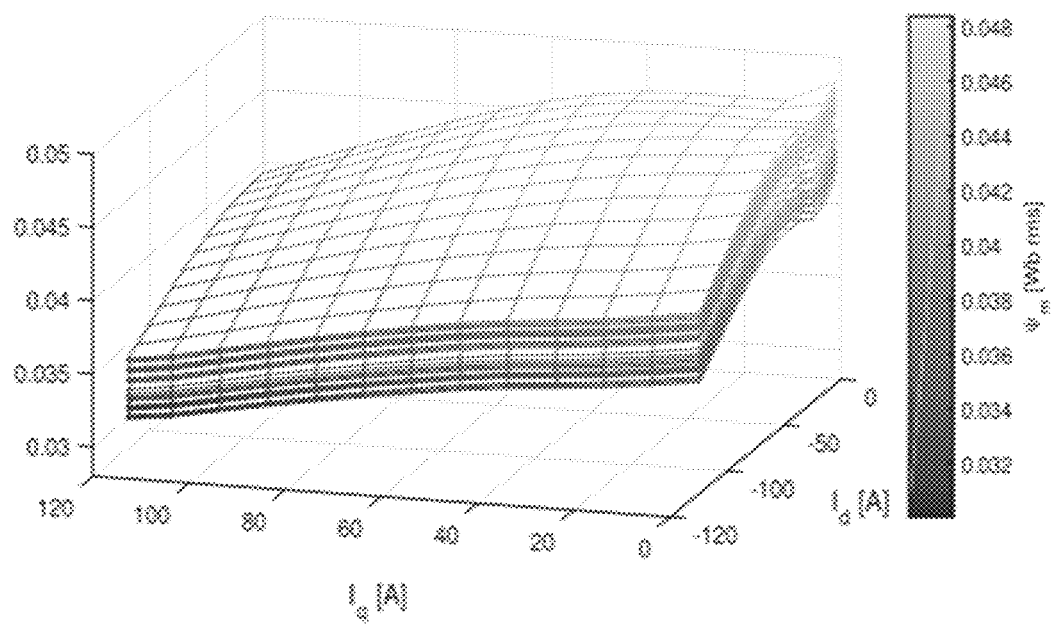

[Fig. 5A]
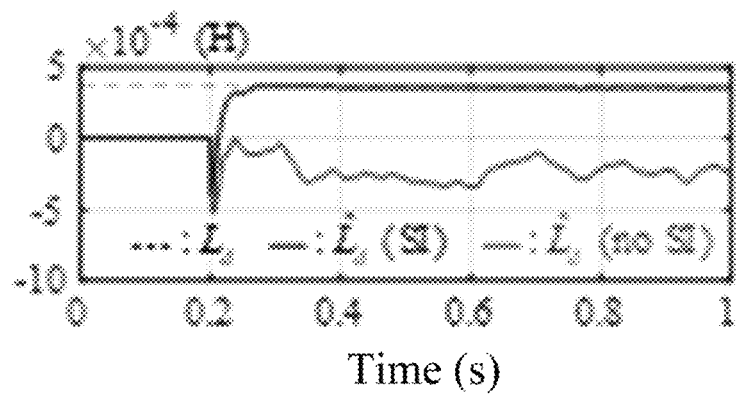
[Fig. 5B]
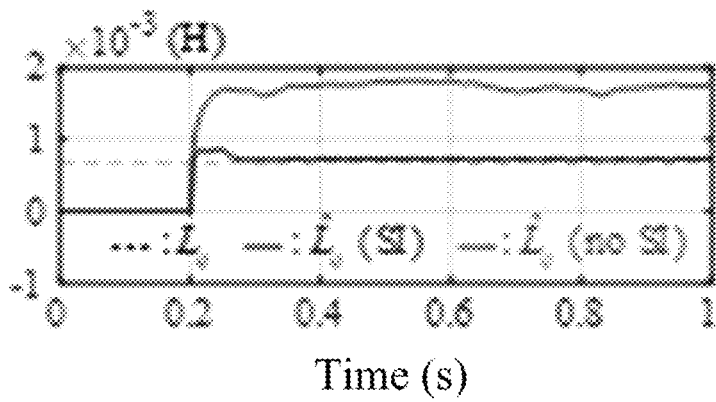

[Fig. 5C]
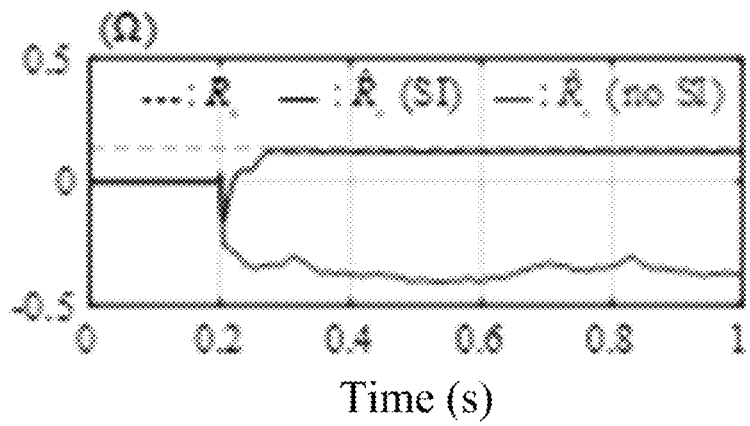
[Fig. 5D]
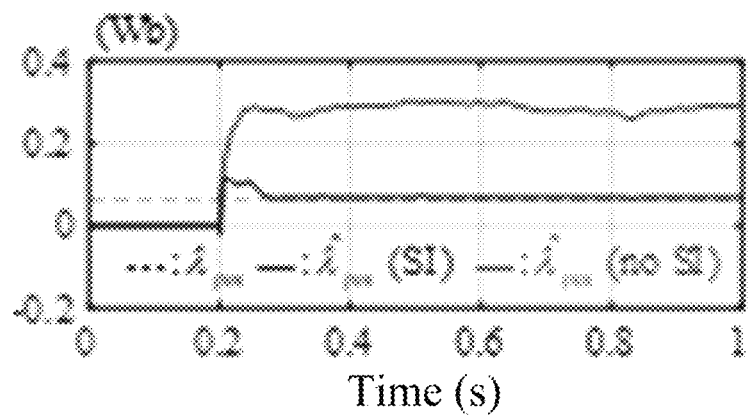

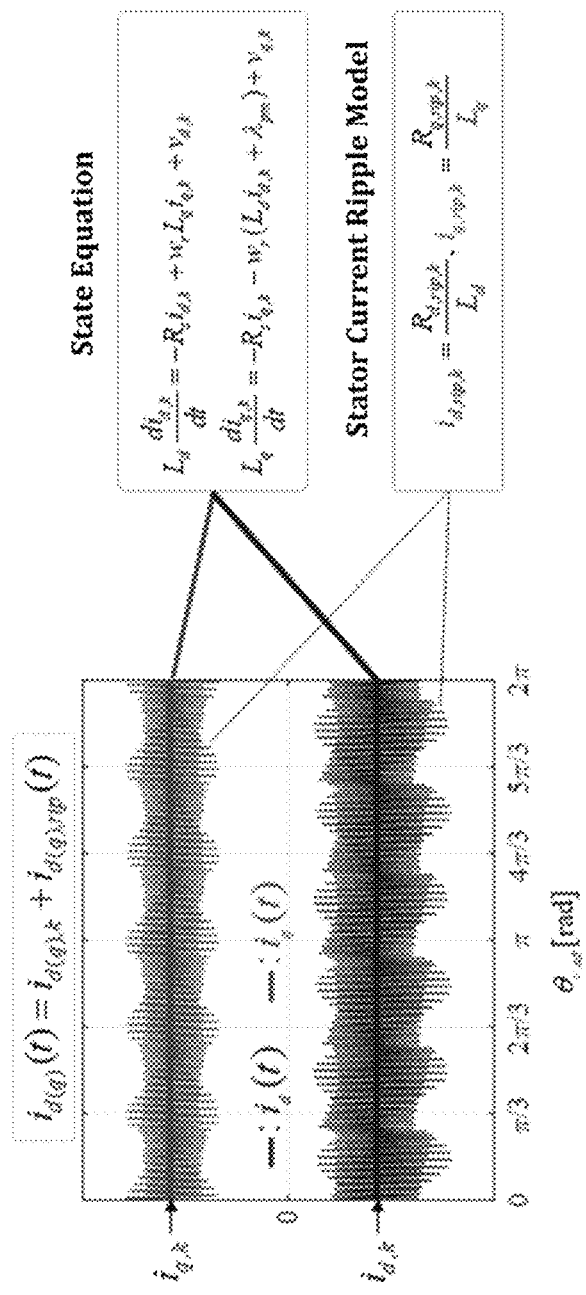
[Fig. 6]

[Fig. 7A]
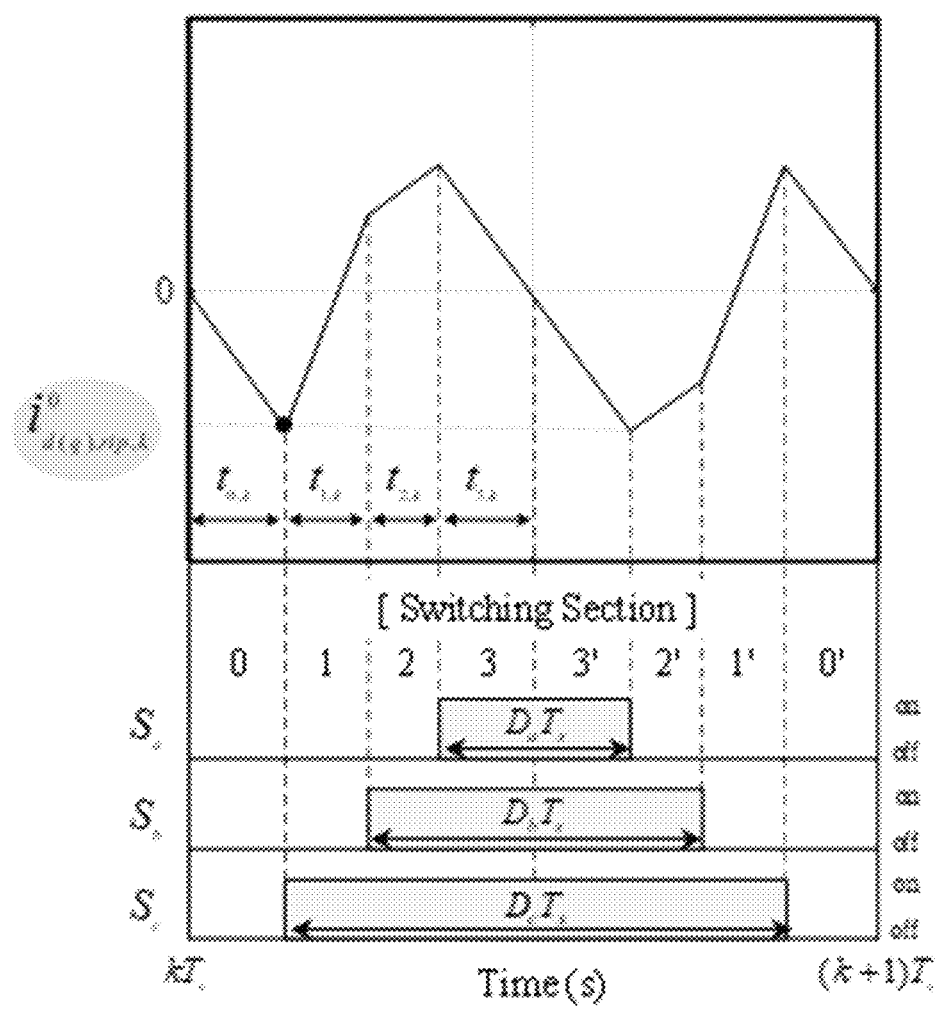

[Fig. 7B]
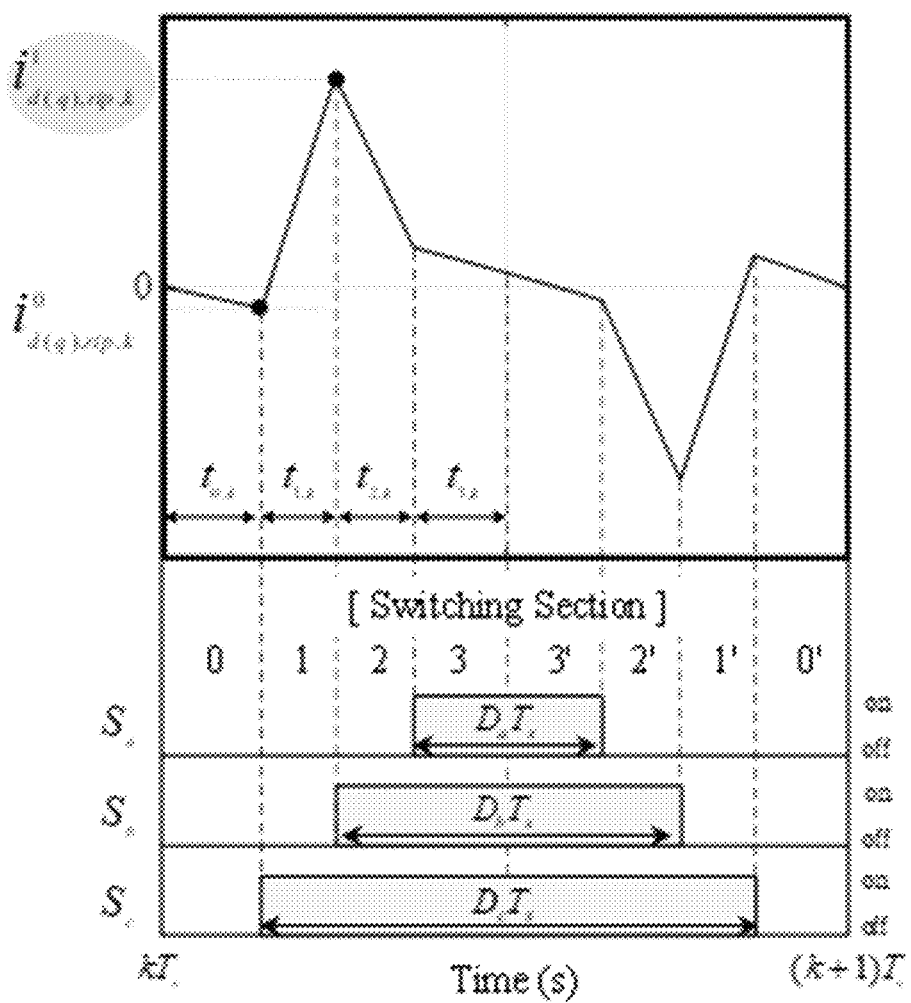

[Fig. 8A]
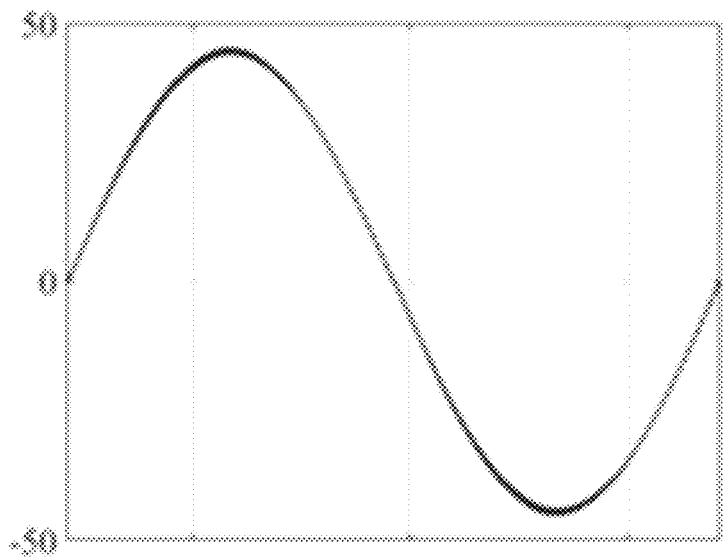
[Fig. 8B]
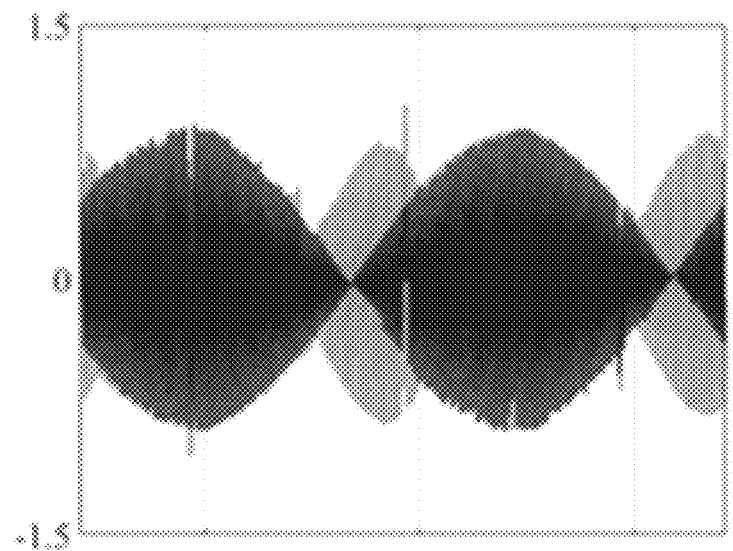

[Fig. 9]
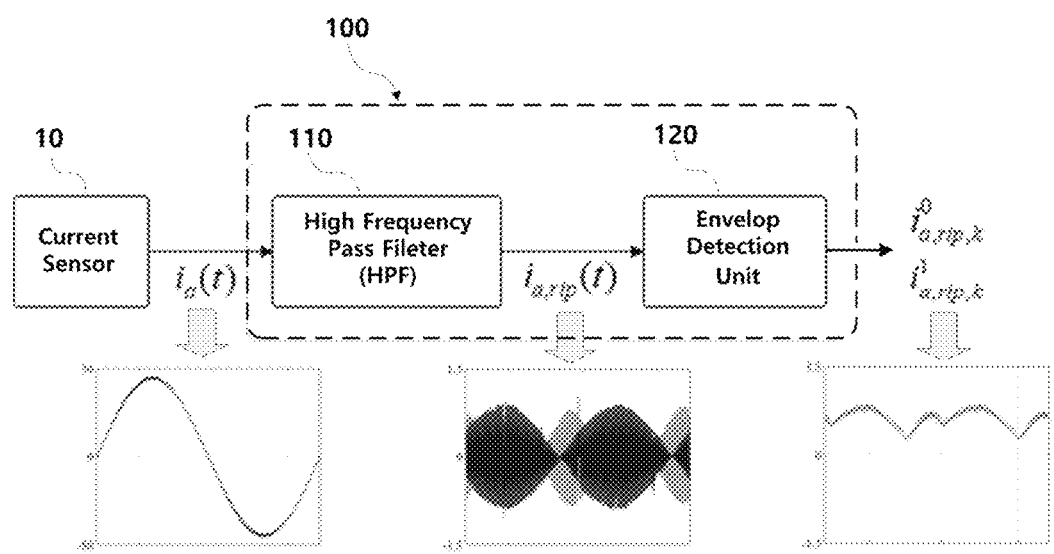

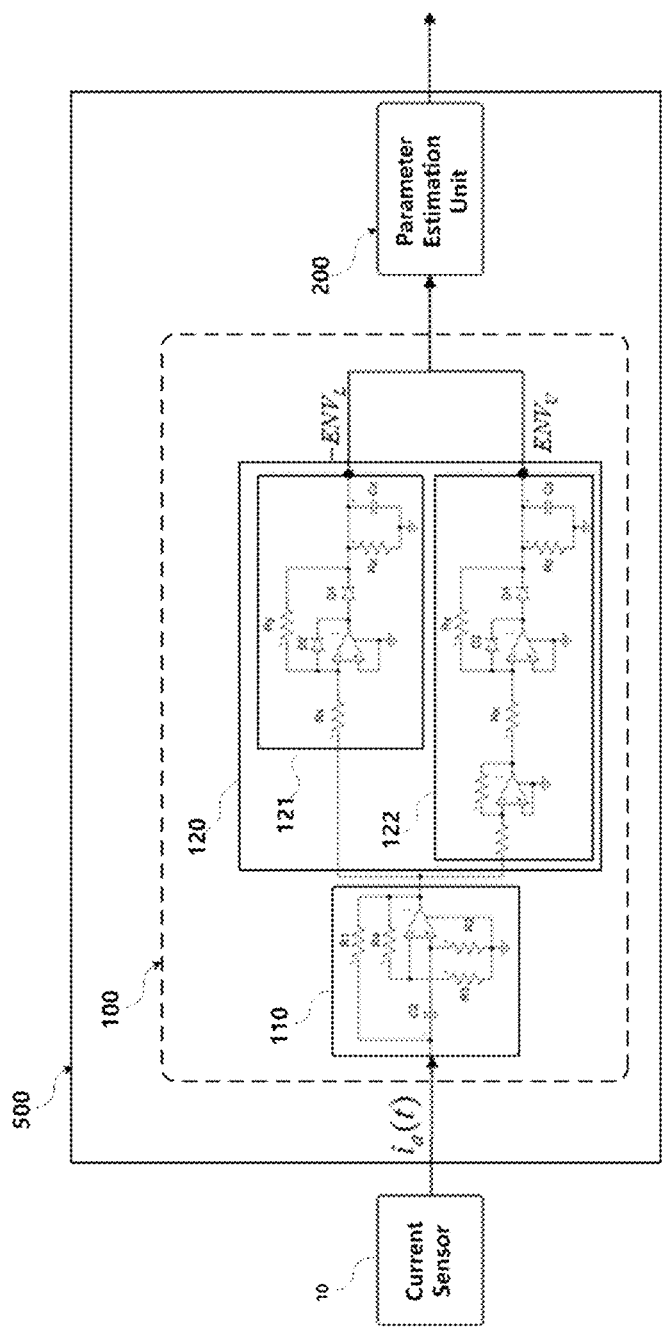
[Fig. 10]

[Fig. 11]
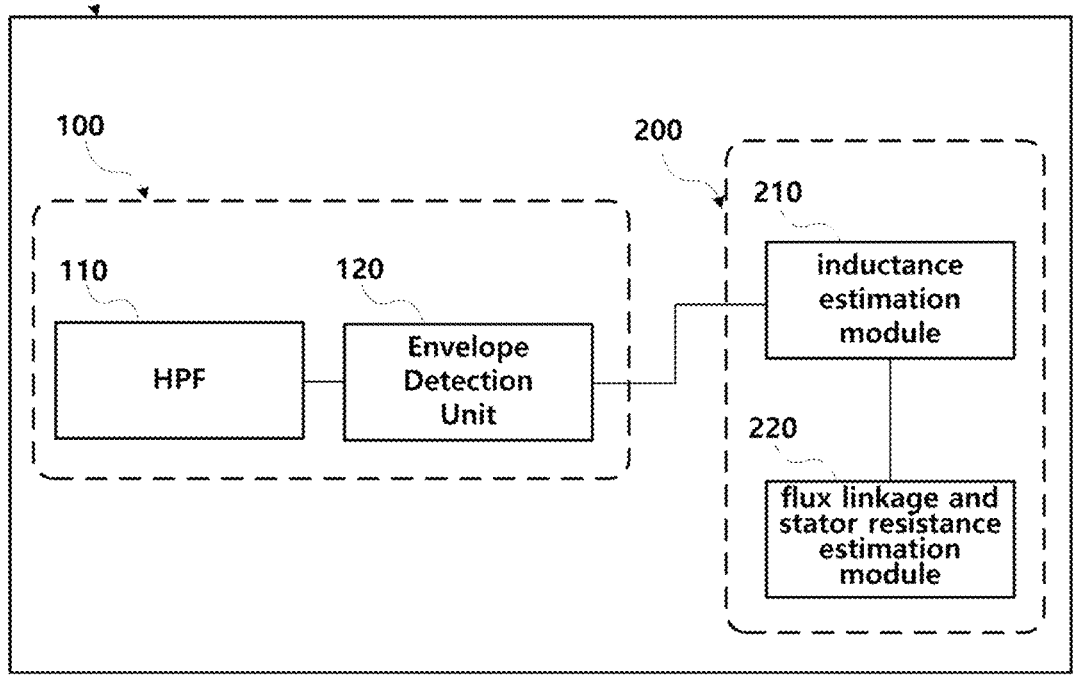

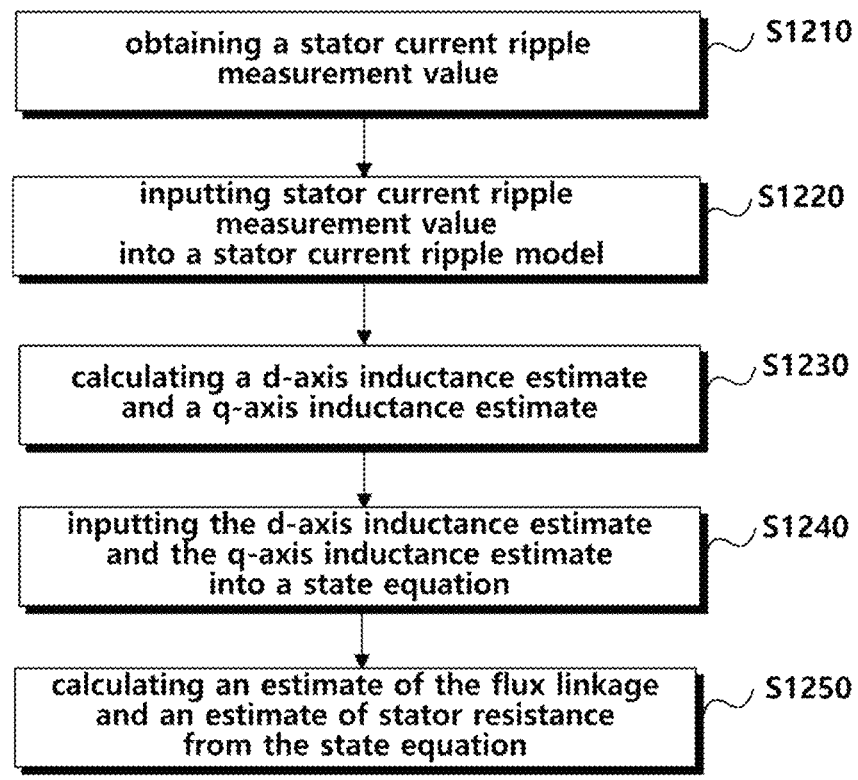
[Fig. 12]

METHOD AND APPARATUS FOR REAL-TIME ESTIMATION OF FULL PARAMETERS OF PERMANENT MAGNET SYNCHRONOUS MOTOR

BACKGROUND OF THE INVENTION

1. Field of the Invention

The present invention relates to a method and apparatus for estimating full parameters of a permanent magnet synchronous motor in real time, and more particularly, to a method for estimating all four parameters of a permanent magnet synchronous motor in real time without additional signal injection, and an apparatus used therein.

2. Description of the Related Art

A permanent magnet synchronous motor is modeled with four electrical parameters: d-axis inductance Ld, q-axis inductance Lq, flux linkage λpm, and stator resistance Rs. Such parameter information is not only essential for improving the control performance of the permanent magnet synchronous motor, but also applied to the technology of securing the reliability of the permanent magnet synchronous motor.

In this regard, a disclosed conventional research involves estimating two parameters based on a state equation. That is, in order to estimate the parameters that exist in the state equation, this method estimates parameters by designing a state observer based on the state equation and using an adaptive control technique. As the state observer, extended Kalman Filter, Luenberger observer, and sliding observer are used, and the state observer is designed to estimate this state variable by defining augmented state variables including not only the motor current but also the parameters to be estimated. As an adaptive control technique, the recursive least squares technique is mainly used, and the state equation is expressed as a linear model for the parameter to be estimated, and then these parameters are calculated through iteration.

However, since the state equation has two equations (that is, rank two), there is a disadvantage in that convergence is not guaranteed due to the "rank deficiency problem" in estimating three or more parameters (that is, in the case that the required rank is three or higher). For this reason, existing parameter estimation methods only estimate the remaining two parameters under the assumption that the two parameters are known. In addition, the accuracy of the estimation of two parameters largely depends on the accuracy of the parameter values that are assumed to be known. If the parameter values that are assumed to be known are inaccurate due to temperature change or sample-to-sample deviation, there was a problem that an error occurred in the parameter being estimated.

In this regard, another study previously disclosed is estimating total parameters based on a signal injection (SI) method. In order to solve the rank deficiency problem in the state equation, a signal injection method was applied. In this method, a high-frequency current signal is additionally injected into the d-axis of the motor, thereby allowing the state equation to have various combinations of equations and artificially make the rank four (4). In this way, real-time estimation of four parameters is possible through signal injection.

However, by this method, although it is possible to estimate four parameters, there is a fundamental problem that motor loss and torque ripple increase. The parameter estimation is aimed at improving the motor driving performance, and it is a disadvantage that the driving performance degradation factor is used to achieve this. In addition, there is also a problem that the current output is limited by the amount of the injected current signal, and the injected signal may act as a disturbance to the motor.

PRIOR ARTS

[Patent Document 1] KR10-1549283 B1
[Patent Document 2] KR10-1761740 B1

SUMMARY OF THE INVENTION

The present invention, as invented to solve such a problem, fundamentally solves the rank deficiency problem in the state equation without the injection of an additional signal by additionally utilizing the "stator current ripple model" in addition to the state equation and an object of the present invention is to provide a method and apparatus capable of estimating four parameters of a permanent magnet synchronous motor in real time.

According to an aspect of the present invention, an apparatus for estimating in real time full parameters of a permanent magnet synchronous motor is provided, the apparatus comprising: a current ripple measuring device for measuring a stator current ripple of the permanent magnet synchronous motor; and, a parameter estimating unit that calculates estimates of d-axis inductance, q-axis inductance, flux linkage and stator resistance of the permanent magnet synchronous motor using the stator current ripple measured by the current ripple measuring device.

According to other aspect of the present invention, a method for estimating in real time full parameters of a permanent magnet synchronous motor by the above-mentioned apparatus is provided, the method comprising the steps of:

(a) measuring, by the stator current ripple measuring device, a stator current ripple of the permanent magnet synchronous motor;

(b) inputting, by the parameter estimating unit, measured values of the stator current ripple (hereinafter, referred to as "stator current ripple measurement value") into a stator current ripple model;

(c) calculating, by the parameter estimating unit, a d-axis inductance estimate and a q-axis inductance estimate of the permanent magnet synchronous motor from the stator current ripple model;

(d) inputting, by the parameter estimating unit, the calculated d-axis inductance estimate and the q-axis inductance estimate into a state equation; and, (e) calculating, by the parameter estimating unit, an estimated value of flux linkage and an estimated value of stator resistance from the state equation.

According to another aspect of the present invention, an apparatus for measuring a stator current ripple of a permanent magnet synchronous motor is provided, the apparatus comprising: a high frequency pass filter that removes a fundamental wave component from a current sensed by a current sensor; and, an envelope detection unit that performs detection of envelope of a current ripple component remaining after passing through the high frequency pass filter and provides the envelope of the detected current ripple component to a parameter estimation unit.

According to still another aspect of the present invention, a method for calculating in real time an estimate of full parameters of a permanent magnet synchronous motor using a stator current ripple value measured in the permanent magnet synchronous motor (hereinafter referred to as "stator current ripple measurement value") is provided, the method comprising: (a) obtaining a stator current ripple measurement value from a stator current ripple signal provided by a stator current ripple measurement device of the permanent magnet synchronous motor and inputting it into a stator current ripple model; (b) calculating a d-axis inductance estimate and a q-axis inductance estimate of the permanent magnet synchronous motor from the stator current ripple model; (c) inputting the d-axis inductance estimate and the q-axis inductance estimate into a state equation; and, (d) calculating an estimate of the flux linkage and an estimate of stator resistance from the state equation.

According to the present invention, by additionally utilizing the "stator current ripple model" in addition to the state equation, the rank deficiency problem in the state equation is fundamentally solved without injection of an additional signal. A method and apparatus capable of estimating four total parameters of a permanent magnet synchronous motor in real time are provided.

BRIEF DESCRIPTION OF THE DRAWINGS

FIG. 1A is a graph showing a decrease in torque control performance due to incorrect parameters.

FIG. 1B is a graph showing a decrease in current control performance due to incorrect parameters.

FIGS. 2A and 2B are graphs illustrating diagnosis of a motor condition through parameter estimation, respectively.

FIG. 3A is a graph illustrating a variation in Ld according to a current.

FIG. 3B is a graph illustrating a variation in Lq according to a current.

FIG. 3C is a graph illustrating a variation in λpm according to temperature.

FIG. 4A to FIG. 4C are graphs illustrating a parameter deviation according to a production tolerance during mass production of a motor, respectively.

FIGS. 5A to 5D are a diagram illustrating an embodiment of a simulation of estimating total parameters through signal injection. FIG. 5A shows an estimation simulation graph for Ld, FIG. 5B shows Lq, FIG. 5C shows Rs, and FIG. 5D shows λpm.

FIG. 6 is a diagram for explaining the concept of a stator current ripple model used in the present invention.

FIG. 7A and FIG. 7B are diagrams showing the principle of generating a stator current ripple peak, respectively.

FIG. 8A shows the a-phase current.

FIG. 8B shows the current ripple of the a-phase current in FIG. 8A.

FIG. 9 is a block diagram of the current ripple measuring apparatus of the present invention and a diagram showing a measurement principle of a phase current ripple.

FIG. 10 is a diagram showing an embodiment of an actual circuit of the current ripple measuring apparatus shown in FIG. 9.

FIG. 11 is a block diagram showing the configuration of a real-time estimation device for all parameters of a permanent magnet synchronous motor.

FIG. 12 is a diagram showing a flow chart of performing a real-time estimation method of all parameters of a permanent magnet synchronous motor according to the present invention.

DETAILED DESCRIPTION OF THE INVENTION

Hereinafter, exemplary embodiments of the present invention will be described in detail with reference to the accompanying drawings. The same or similar components are assigned the same or similar reference numerals, and redundant descriptions thereof will be omitted. In describing the embodiments disclosed in the present specification, when it is considered that a detailed description of related known technologies may obscure the subject matter of the embodiments of the present specification, the detailed description thereof will be omitted. The accompanying drawings are only for making it easier to understand the embodiments disclosed in the present specification, and the technical idea disclosed in the present specification is not limited by the accompanying drawings. It is to be understood as including all changes, equivalents, or substitutions included in the spirit and scope of the present invention.

Terms including ordinal numbers, such as first and second, can be used to describe various components, but these terms are used only for the purpose of distinguishing one component from another, and the corresponding components are not limited by these terms. Singular expressions include plural expressions, unless the context clearly indicates otherwise.

As used herein, terms such as "comprises", "includes" or "have" should be understood as limiting the existence of features, steps, elements, or combinations thereof described in the specification and it is not intended to exclude the possibility of the presence or addition of one or more features, steps, components, or combinations thereof.

FIGS. 1A and 1B are graphs showing decreases in torque control performance and current control performance due to incorrect parameters, respectively.

As shown in the graphs of FIGS. 1A and 1B, when the permanent magnet synchronous motor is driven, torque control and current control by incorrect parameters results in a very serious decrease in control performance. For this reason, minimum Ld and Lq parameter information is required for "optimum torque control" to find the optimum current command for a given torque command. Furthermore, in order to maximize performance, information on the remaining two parameters, λpm and Rs, is also required.

FIGS. 2A and 2B are graphs illustrating diagnosis of a motor condition through parameter estimation.

The state of the stator can be estimated through estimation of the parameters Ld, Lq, and Rs, and the state of the rotor can be estimated through the estimation of the parameter λpm. In addition, in the event of a sensor failure, it is possible to perform sensorless control based on such parameter information.

FIGS. 3A-3C are graphs illustrating a change state of a parameter according to current and temperature, respectively.

FIG. 3A is a graph illustrating a variation in Ld according to a current, FIG. 3B is a variation in Lq according to a current, and FIG. 3C is a graph illustrating a variation in λpm according to temperature.

It can be seen that Ld and Lq vary greatly by current id and iq due to self-saturation, and λpm tends to be inversely proportional to the internal temperature of the motor. Also, Rs has a tendency to be linearly proportional to the motor stator temperature.

FIGS. 4A-4C are graphs illustrating a parameter deviation according to a production tolerance during mass production of a motor, respectively.

In mass production of motors, parameter deviations between motor samples occur depending on the tolerances of the stator and rotor design variables. The level of deviation can occur up to ±10% of the nominal value.

FIGS. 5A-5D are diagrams illustrating an embodiment of a simulation of total parameter estimation through signal injection (SI).

As described above, in order to solve the rank deficiency problem in the state equation, a signal injection method can be applied. In this method, a high-frequency current signal is additionally injected into the d-axis of the motor so that the state equation has various combinations of equations, and the rank is artificially made to be four (4). This enables real-time estimation of four (4) parameters through signal injection. FIG. 5 is an embodiment of an overall parameter estimation simulation through such signal injection.

The horizontal axis of each graph of FIGS. 5A-5D represents time (sec). FIG. 5A shows an estimation simulation graph for Ld, FIG. 5B shows Lq, FIG. 5C shows Rs, and FIG. 5D shows λpm. In each graph, the dotted line (1) is the actual value of the parameter, the blue line (2) is the estimated parameter value when signal injection (SI) is performed, and the red line (3) is the parameter estimated value when signal injection (SI) is not present. The injected signal is a high-frequency current signal applied to the d-axis of the motor, and $\Delta i_d = A \cdot \sin(wt)$. The current equation in case the signal is injected is given by:

$$i_d^* = i_{d0} + \Delta i_d$$

in the above, $$\frac{di_d}{dt} \neq 0; \Delta i_d = \pm A_{SI} \text{ or } \Delta i_d = A_{SI}\sin(wt),$$

where $A_{SI}=(0.05\sim0.2)I_{max}$.

As described above, by this method, four parameters can be estimated, but there is a fundamental problem of increasing motor loss and torque ripple. In other words, parameter estimation is aimed at improving the motor driving performance, but the disadvantage is that the driving performance degradation factor is used for this purpose. In addition, there is also a problem that the current output is limited by the amount of the injected current signal, and the injected signal may act as a disturbance to the motor. In this case, the motor losses due to the injection signal are:

$$P_{loss} = \frac{3}{2}R_s(i_{d0}^2 + i_q^2) + \frac{3}{2}R_s(\Delta i_d)_{rms}^2.$$

And the torque ripple due to the injection signal is obtained as below:

$$T_e = \frac{3P}{2}(\lambda_{pm} + (L_d - L_q)i_{d0})i_q + \frac{3P}{2}(L_d - L_q)i_q\Delta i_d.$$

FIG. 6 is a diagram for explaining the concept of a stator current ripple model used in the present invention.

The present invention provides a method and apparatus for estimating all four parameters of a permanent magnet synchronous motor in real time by fundamentally solving the rank deficiency problem in a state equation without signal injection. This is achieved by additionally utilizing the "stator current ripple model" in addition to the state equation.

The stator current ripple model has a rank two (2) independent of the state equation, and the magnitudes of d- and q-axis current ripples are inversely proportional to B- and q-axis inductances (Ld, Lq), respectively. Stator current ripple measurements are obtained from an analog circuit for measuring stator current ripple, and d- and q-axis inductances can be estimated independently of the state equation. After substituting the estimated d- and q-axis inductance values in the state equation and converting them into a model for the remaining two parameters (λpm, Rs), the two parameters are estimated from this model.

FIGS. 7A and 7B are diagrams showing the principle of generating a stator current ripple peak, respectively.

The stator current ripple is caused by the switching operation of the inverter that supplies voltage to the motor. Three-phase switches are sequentially opened within one switching period, and when the first switch is opened or the second switch is opened, a peak of d- and q-axis current ripple may occur. When these are referred to as $i_{d(q),rip}^0$ and $i_{d(q),rip}^1$, respectively, the peaks of the d- and q-axis current ripple can be represented by the following model:

$$i_{dq,rip,k}^0 = \Delta i_{dq,k}^0 = L_{dq}^{-1}R_{dq,k}^0 \quad \text{[Equation 1]}$$

$$i_{dq,rip,k}^1 = \Delta i_{dq,k}^0 + \Delta i_{dq,k}^1 = L_{dq}^{-1}R_{dq,k}^1 \quad \text{[Equation 2]}$$

where, $$R_{dq,k}^0 = -t_{0,k}\bar{v}_{dq,k},$$

$$R_{dq,k}^1 = -(t_{0,k}+t_{1,k})\bar{v}_{dq,k} + t_{1,k}v_{dq,k}^1$$

and the meaning of each notation is as follows:

$t_{0,k}$: time from the start of the switching cycle to the opening of the first switch;

$t_{1,k}$: time from when the first switch is opened to when the second switch is opened;

$v_{dq,k}$: average d-, q-axis voltage vector within the switching period;

$v_{dq,k}^1$: d- and q-axis voltage vector applied while the first switch is open.

This model can be transformed from a-phase into the following model through rotation transformation:

$$i_{a,rip,k}^n = [\cos\theta_r - \sin\theta_r]\begin{bmatrix} i_{d,rip,k}^n \\ i_{q,rip,k}^n \end{bmatrix} \quad \text{[Equation 3]}$$

$$= [\cos\theta_r R_{d,k}^n - \sin\theta_r R_{q,k}^n]\begin{bmatrix} 1/L_d \\ 1/L_q \end{bmatrix}$$

where, n is 0 or 1; and a-phase is an example, and the same algorithm can be configured with a current ripple model in the b-phase or c-phase.

FIGS. 8A and 8B are diagrams showing an embodiment of measuring a-phase current and current ripple, respectively.

FIG. 8A shows the a-phase current, and FIG. 8B shows the current ripple of the a-phase current.

The a-phase current includes a fundamental wave component and a current ripple component of a frequency proportional to the electric angular velocity of the motor, and the current ripple has a switching frequency and a higher frequency component.

FIG. 9 is a block diagram of a current ripple measuring apparatus 100 of the present invention and a diagram showing a measurement principle of a-phase current ripple, and FIG. 10 shows an embodiment of an actual circuit of the current ripple measuring apparatus shown in FIG. 9.

The a-phase current ripple can be obtained by removing the fundamental wave component from the a-phase current. To this end, the a-phase current measured value is first passed through a high frequency pass filter (HPF) 110. The cutoff frequency of the high frequency pass filter 110 must be greater than or equal to the maximum value of the fundamental component frequency of the a-phase current, and must be less than or equal to the switching frequency in order to reduce the current ripple signal. As the high frequency pass filter 110, a second-order active high frequency pass filter or the like may be used.

An envelope detector 120 is used to obtain a peak value of the current ripple component remaining through the high frequency pass filter 110. The voltage value obtained through this corresponds to $i_{a,rip}^0$ or $i_{a,rip}^1$, and this is the peak value of the current ripple component. As the envelope detector 120, a diode detector or the like may be used. When the voltage drop component of the diode used for this is large, the diode can be replaced with a precision rectifier or the like.

If the fundamental wave component of the a-phase current is not sufficiently removed even through the high frequency pass filter 110, the lower envelope detector 121 and the upper envelope detector 122 of the filter output value is used to detect both the upper and lower envelopes, and then calculate the difference between the values and divide by two (2), thereby canceling the fundamental wave component of the a-phase current that has not been removed to obtain only the peak value of the current ripple component.

Using this stator current ripple measurement, the d- and q-axis inductance (Ld, Lq) is estimated as follows: after substituting the current ripple measurement value (the peak value of the current ripple component) into the stator current ripple model (Equation 4), convert this into a linear parameter model for d- and q-axis inductance (Equation 5), and d- and q-axis inductance estimates ($\hat{L}_d$, $\hat{L}_q$) are obtained from this linear parameter model. Methods of obtaining $\hat{L}_d$ and $\hat{L}_q$ from such a linear parameter model are various, but as an example, a recursive least squares method, a least squares method, or the like may be applied. Equation 4 is an equation excluding only the middle part equation in Equation 3.

Alternatively, without converting to a linear parameter model (Equation 5), the current ripple measurement value can be substituted into the stator current ripple model (Equation 4) to obtain d- and q-axis inductance estimates ($\hat{L}_d$, $\hat{L}_q$). This is because the linear parameter model (Equation 5) is the same as the stator current ripple model (Equation 4).

In either case, whether the stator current ripple model (Equation 4) or the linear parameter model (Equation 5) is used, the current ripple measurement $i_{a,rip,k}^n$ must be substituted with two values. That is, two stator current ripple measurements (which may be $i_{a,rip,k}^0$ or $i_{a,rip,k}^1$, respectively) measured at two different motor rotation angle values ($\theta_r$) are obtained, and these are respectively substituted into Equation 4 (or Equation 5). Find $\hat{L}_d$ and $\hat{L}_q$ from the two equations.

$$i_{a,rip,k}^n = [\cos\theta_r R_{d,k}^n - \sin\theta_r R_{q,k}^n] \begin{bmatrix} 1/L_d \\ 1/L_q \end{bmatrix} \quad \text{[Equation 4]}$$

$$y_{1,k} = |Z_{1,k}\Theta_1| \quad \text{[Equation 5]}$$

where, $y_{1,k} = i_{a,rip,k}^{meas}$, $\Theta_1 = [1/L_d \ 1/L_q]^T$,
$Z_{1,k} = [\cos\theta_r R_{d,k}^n - \sin\theta_r R_{q,k}^n]$.

Also, the flux linkage ($\lambda_{pm}$) and stator resistance ($R_s$) are estimated using the state equation. That is, after substituting the d- and q-axis inductance estimates ($\hat{L}_d$, $\hat{L}_q$) into the state equation (Equation 6, Equation 7), it is converted into a linear parameter model for the flux linkage and stator resistance (Equation 8), and, from this, an estimate of the flux linkage and an estimate of the stator resistance ($\hat{\lambda}_{pm}$, $\hat{R}_s$) are obtained. Various methods of obtaining $\hat{\lambda}_{pm}$ and $\hat{R}_s$ from such a linear parameter model are also possible, but as an embodiment, a recursive least squares method, a least squares method, or the like may be applied.

Here, as in the case of obtaining the inductance estimates ($\hat{L}_d$, $\hat{L}_q$), the inductance estimates ($\hat{L}_d$, $\hat{L}_q$) are substituted into the state equations (Equations 6 and 7) without converting to a linear parameter model (Equation 8). Thereafter, the estimated value of the flux linkage and the estimated value of stator resistance ($\hat{\lambda}_{pm}$, $\hat{R}_s$) may be obtained from this. This is because the linear parameter model (Equation 8) is the same as the state equation (Equation 6, Equation 7).

$$\hat{L}_{d,k}\frac{di_{d,k}}{dt} = -R_s i_{d,k} + w_r \hat{L}_{q,k} i_{q,k} + v_{d,k} \quad \text{[Equation 6]}$$

$$\hat{L}_{q,k}\frac{di_{q,k}}{dt} = -R_s i_{q,k} - w_r(\hat{L}_{d,k} i_{d,k} + \lambda_{pm}) + v_{q,k} \quad \text{[Equation 7]}$$

$$y_{2,k} = Z_{2,k}\Theta_2 \quad \text{[Equation 8]}$$

where, $$y_{2,k} = \begin{bmatrix} v_{d,k} + w_r \hat{L}_{q,k} i_{q,k} \\ v_{q,k} - w_r \hat{L}_{d,k} i_{d,k} \end{bmatrix},$$

$$Z_{2,k} = \begin{bmatrix} 0 & i_{d,k} \\ w_r & i_{q,k} \end{bmatrix},$$

$$\Theta_2 = \begin{bmatrix} \lambda_{pm} \\ R_s \end{bmatrix},$$

$$\hat{L}_{d,k}\frac{di_{d,k}}{dt} \cong 0,$$

and $$\cong \hat{L}_{q,k}\frac{di_{q,k}}{dt} \cong 0.$$

FIG. 11 is a block diagram showing the configuration of an apparatus for estimating all parameters of a permanent magnet synchronous motor in real time, and FIG. 12 is a flowchart illustrating a method of estimating all parameters of a permanent magnet synchronous motor in real time according to the present invention.

Since the real-time estimation method of all parameters of the permanent magnet synchronous motor has already been described in detail with reference to FIGS. 6 to 11, the overall process for performing this will be briefly summarized and described with reference to FIG. 12.

First, the stator current ripple measurement apparatus 100 measures the stator current ripple of the permanent magnet synchronous motor (S1210). The stator current ripple measurement device 100 removes the fundamental wave component by passing the current sensed by the current sensor through a high frequency pass filter (HPF) 110, and removes the fundamental wave component. The envelope of the current ripple component is detected by the envelope detector 120, and the envelope signal of the detected current ripple component is provided to the parameter estimator 200. The parameter estimating unit 200 detects the peak value of the current ripple component from the envelope signal of the provided current ripple component and substitutes the peak value of the current ripple component into the stator current ripple model as a measurement value of the stator current ripple.

In this case, the envelope detection may detect only one envelope, but in case the fundamental wave component of the a-phase current is not sufficiently removed even through the high frequency pass filter (HPF) 110 as described above, the lower envelope detector 121 and the upper envelope detector 122 detect a lower envelope and an upper envelope, respectively, and both the lower envelope signal and the upper envelope signal detected may be provided to the parameter estimating unit 200.

When only one envelope signal is provided, the parameter estimating unit 200 obtains a peak value from the envelope signal and substitutes it into the stator current ripple model as a stator current ripple measurement value (S1220). However, in the case of receiving both the lower envelope signal and the upper envelope signal, the difference between the lower envelope signal and the upper envelope signal value is divided by two (2) to calculate the peak value of the current ripple component, and this is substituted into the stator current ripple model as a measurement value of the stator current ripple (S1220).

The inductance estimation module 210 of the parameter estimation unit 200 calculates a d-axis inductance estimate and a q-axis inductance estimate of the permanent magnet synchronous motor from the stator current ripple model (S1230). Thereafter, the flux linkage and stator resistance estimation module 220 of the parameter estimating unit 200 substitutes the calculated d-axis inductance estimate and q-axis inductance estimate into the state equation (S1240), from which the estimated value of the flux linkage and the estimated value of the stator resistance are calculated (S1250).

The fields in which the method and apparatus for real-time estimation of all parameters of the permanent magnet synchronous motor of the present invention as described so far can be used are briefly summarized as follows:

1) Real-Time Torque Control of Permanent Magnet Synchronous Motor

In the existing industry, torque control has been performed based on parameter data obtained through an offline experiment. However, if parameter information is estimated in real time by applying the present invention, optimal torque control can be performed in real time without prior experimentation.

2) Improvement of Current Control Performance of Permanent Magnet Synchronous Motor Previously, nominal parameter values were used in the design of current controllers, and parameter errors were addressed through disturbance observers or tuning of control gains. If parameter information is estimated in real time by applying the present invention, the performance of current control can be greatly improved by using the estimated parameter value in the current controller, and the burden on additional devices for responding to parameter errors can be reduced. In addition, advanced control techniques that rely heavily on parameter accuracy, such as model predictive control, can also be applied.

3) Expansion of Fault Diagnosis Range of Permanent Magnet Synchronous Motor

In the past, since only some parameters were estimated, the range of failure diagnosis using parameter estimates was limited, but by applying the present invention to estimate all parameter information in real time, a wide range of failure diagnosis can be performed. The aging or disconnection of the stator winding can be determined through the estimate $R_s$, the short circuit of the stator winding, etc. can be determined through the estimates $L_d$ and $L_q$, and the internal temperature of the motor and the state of the permanent magnet can be determined through the estimate $\lambda_{pm}$. In addition, fault diagnosis of sensors (current sensor, resolver, etc.) is possible through a state equation model based on accurate parameter information.

The above detailed description should not be construed as limiting in any respect, but should be considered as illustrative. The scope of the present invention should be determined by rational interpretation of the appended claims, and all changes within the equivalent scope of the present invention are included in the scope of the present invention.

What is claimed is:

1. An apparatus for estimating in real time full parameters of a permanent magnet synchronous motor, comprising:
    a current ripple measuring device for measuring a stator current ripple of the permanent magnet synchronous motor; and,
    a parameter estimating unit that calculates estimates of d-axis inductance, q-axis inductance, flux linkage and stator resistance of the permanent magnet synchronous motor using the stator current ripple measured by the current ripple measuring device.

2. A method for estimating in real time full parameters of a permanent magnet synchronous motor by the apparatus of claim 1, comprising the steps of:
    (a) measuring, by the stator current ripple measuring device, a stator current ripple of the permanent magnet synchronous motor;
    (b) inputting, by the parameter estimating unit, measured values of the stator current ripple (hereinafter, referred to as "stator current ripple measurement value") into a stator current ripple model;
    (c) calculating, by the parameter estimating unit, a d-axis inductance estimate and a q-axis inductance estimate of the permanent magnet synchronous motor from the stator current ripple model;
    (d) inputting, by the parameter estimating unit, the calculated d-axis inductance estimate and the q-axis inductance estimate into a state equation; and,
    (e) calculating, by the parameter estimating unit, an estimated value of flux linkage and an estimated value of stator resistance from the state equation.

3. The method according to claim 2,
    wherein the stator current ripple measurement value is calculated from two different motor rotation angle values and the calculated two stator current ripple measurement values respectively input to the stator current ripple model of step (b).

4. The method according to claim 2,
    wherein the step (a) includes:
    (a1) removing a fundamental wave component by passing a current sensed by a current sensor through a high frequency pass filter;
    (a2) detecting an envelope of a current ripple component which remain after the fundamental wave component is removed in the step (a1); and, (a3) providing the envelope of the current ripple component to a parameter estimation unit, and wherein the parameter estimating unit detects a peak value of the current ripple component from the envelope of the current ripple component and inputs it to the stator current ripple model as the stator current ripple measurement value.

5. The method according to claim 4, wherein, in the step (a2), a lower envelope and an upper envelope are detected, respectively, wherein, in the step (a3), both the lower envelope and the upper envelope are provided to the parameter estimation unit, and, wherein the parameter estimating unit calculates a peak value of a current ripple component by dividing the difference between the values of the lower envelope and the upper envelope by two (2) and inputs this to the stator current ripple model as a stator current ripple measurement value.

6. An apparatus for measuring a stator current ripple of a permanent magnet synchronous motor, comprising:

a high frequency pass filter that removes a fundamental wave component from a current sensed by a current sensor; and, an envelope detection unit that performs detection of envelope of a current ripple component remaining after passing through the high frequency pass filter and provides the envelope of the detected current ripple component to a parameter estimation unit.

7. The apparatus according to claim 6, wherein the envelope detection unit including:

a lower envelope detector for detecting a lower envelope; and, an upper envelope detector to detect an upper envelope, and, wherein both the lower envelope and the upper envelope are provided to the parameter estimation unit.

8. A method for calculating in real time an estimate of full parameters of a permanent magnet synchronous motor using a stator current ripple value measured in the permanent magnet synchronous motor (hereinafter referred to as "stator current ripple measurement value"), comprising:

(a) obtaining a stator current ripple measurement value from a stator current ripple signal provided by a stator current ripple measurement device of the permanent magnet synchronous motor and inputting it into a stator current ripple model;

(b) calculating a d-axis inductance estimate and a q-axis inductance estimate of the permanent magnet synchronous motor from the stator current ripple model;

(c) inputting the d-axis inductance estimate and the q-axis inductance estimate into a state equation; and, (d) calculating an estimate of the flux linkage and an estimate of stator resistance from the state equation.

9. The method according to claim 8, wherein the stator current ripple signal provided from the stator current ripple measurement device is an envelope of a current ripple component remaining after removing a fundamental wave component by passing through the high frequency pass filter, wherein a peak value is detected from the envelop of the current ripple component and is inputted into the stator current ripple model as the stator current ripple measurement value.

10. The method according to claim 9, wherein the envelope of the current ripple component includes a lower envelope and an upper envelope, and, wherein the peak value of the current ripple component is calculated by dividing the difference between the values of the lower envelope and the upper envelope by two (2) and is inputted into the stator current ripple model as the stator current ripple measurement value.

11. The method according to claim 8, wherein the stator current ripple model of the step (a) is as follows:

$$i_{a,rip,k}^n = [\cos\theta_r R_{d,k}^n - \sin\theta_r R_{q,k}^n]\begin{bmatrix} 1/L_d \\ 1/L_q \end{bmatrix}$$

where, $L_d$ is the d-axis inductance, $L_q$ is the q-axis inductance, $\theta_r$ is the motor rotation angle, and $i_{a,rip,k}^n$ is the stator current ripple measurement value.

12. The method according to claim 11, wherein two stator current ripple measurement values are obtained at two different motor rotation angle values $(\theta_r)$, and, wherein the d-axis inductance estimate $\hat{L}_d$ and the q-axis inductance estimate $\hat{L}_q$ are obtained from two equations by inputting the two stator current ripple measurement values respectively into the stator current ripple model.

13. The method according to claim 8, wherein the state equation in the step (c) is, $$\hat{L}_{d,k}\frac{di_{d,k}}{dt} = -R_s i_{d,k} + w_r \hat{L}_{q,k} i_{q,k} + v_{d,k}$$

and, $$\hat{L}_{q,k}\frac{di_{d,k}}{dt} = -R_s i_{q,k} - w_r(\hat{L}_{d,k} i_{d,k} + \lambda_{pm}) + v_{q,k}$$

where, $\hat{L}_d$ is the d-axis inductance estimate, $\hat{L}_d$ is the q-axis inductance estimate, $R_s$ is the measured stator resistance, $\lambda_{pm}$ is the measured flux linkage, from which the stator resistance estimate $\hat{R}_s$ and the flux linkage estimate $\hat{\lambda}_{pm}$ are obtained.

* * * * *